US005956544A

United States Patent [19]

Stern et al.

[11] Patent Number: 5,956,544

[45] Date of Patent: Sep. 21, 1999

[54] ELECTROSTATOGRAPHIC REPRODUCTION APPARATUS WITH ELECTROMETER CONTROL AND METHOD OF CALIBRATING THE ELECTROMETER

[75] Inventors: Philip A. Stern, Spencerport; Anne F. Lairmore, Hilton; Allen J. Rushing, Webster, all of N.Y.

[73] Assignee: Eastman Kodak Company, Rochester, N.Y.

[21] Appl. No.: 08/970,832

[22] Filed: Nov. 14, 1997

[51] Int. Cl.[6] ........................... G03G 15/00; G01R 29/12

[52] U.S. Cl. ................................................ 399/73; 324/457

[58] Field of Search ........................ 399/48, 73; 324/457, 324/458

[56] References Cited

U.S. PATENT DOCUMENTS

| | | | |
|---|---|---|---|
| 3,998,538 | 12/1976 | Urso et al. | 399/73 |
| 4,390,265 | 6/1983 | Suzuki et al. | 399/73 X |
| 4,433,298 | 2/1984 | Palm | 324/457 |
| 4,473,029 | 9/1984 | Fritz et al. | 399/236 |
| 4,546,060 | 10/1985 | Miskinis et al. | 430/108 |
| 5,357,319 | 10/1994 | Nagashima | 399/48 |
| 5,625,857 | 4/1997 | Shimada et al. | 399/49 |
| 5,649,266 | 7/1997 | Rushing | 399/59 |

*Primary Examiner*—Fred L. Braun
*Attorney, Agent, or Firm*—Norman Rushefsky

[57] ABSTRACT

An electrometer probe is used in an electrophotographic apparatus as part of a process control system to measure charge on a photoconductive film belt. This measurement is used to control voltage level or other process parameter of the electrophotographic process. The probe is supported in an electrometer probe holder so that a sensor aperture of the probe is at a fixed distance from the film belt. In order to ensure proper operation of the electrometer probe, a method and an apparatus for independently calibrating the electrometer probe is provided. A curved plate is provided on the electrometer probe holder. The plate is mounted at the same spacing from the probe aperture as the film belt. This plate has a receptacle for the service person's test lead to attach. The other end of the test lead is attached to a test point for the toning station bias supply. The probe may be reoriented on the probe holder to position the probe aperture at the fixed distance to the plate. Using a service test program, different biases are applied to the plate, and the response of the electrometer is monitored. In this way, troubleshooting of electrometer related errors is easily done without the need to remove the electrometer probe to a special test apparatus.

23 Claims, 8 Drawing Sheets

ELECTROSTATOGRAPHIC REPRODUCTION APPARATUS WITH ELECTROMETER CONTROL AND METHOD OF CALIBRATING THE ELECTROMETER

FIELD OF THE INVENTION

This invention relates to electrostatographic reproduction apparatus and methods and more particularly, to improved apparatus and methods for controlling electrostatographic machine operating potentials.

BACKGROUND OF THE INVENTION

The efficiency of electrophotographic type copiers or printers depends upon the proper relative charge being maintained between a photoconductive imaging member and a developing means. This charge relationship is relied upon to attract development material, i.e. toner, from a supply source to the photoconductive member in conformance with both the outline and density of the electrostatic image on the photoconductive member. The electrostatic image which undergoes this development may be formed through the expediency of exposing the previously charged photoconductive member to a light image of the original being copied or to exposure by an electro-optical exposure source.

One method of sustaining the proper charge relationship between the photoconductive member and the developing means is to use an electrostatic voltmeter, commonly called an electrometer, to sense potentials on the photoconductive member at some appropriate point. This device can be used as a service instrument to provide, by meter, a visible indication of the photoreceptor charge condition from which the electrostatic development field can be manually adjusted. In other cases, a feedback loop may be provided as part of a process control to enable readings from the electrometer to be used to automatically control the development field. Control over the electrostatic development field may be done, for example, by controlling or regulating the developer bias, or by controlling potentials on the photoconductor itself by regulating the corona charging means.

In machines of the type alluded to, adjustment of one or more of the various operating parameters, such as the primary charge potential level, normally requires that the bias be identified, and changes made therein monitored. Failing to monitor the bias, and changes thereto, may result in biases exceeding safe or designed maximum levels or problems in control of image quality.

Further, electrometers, like most test instruments, require calibration checks from time to time to assure that the readings obtained are accurate.

In U.S. Pat. No. 3,998,538, an electrometer probe is described wherein a probe support supports the probe. A further supporting structure is provided so that the probe can be mounted on the probe support at a fixed spatial relationship relative to a photoconductive imaging member. In order to check the probe for calibration it is necessary for a service person to remove the probe with its support from the supporting structure and position the probe and the probe support in a calibration receptacle. The receptacle includes a test plate electrode positioned such that the probe when seated in the receptacle is positioned from the test plate electrode in a preset spaced relationship. With a known electrical bias provided to the test plate electrode a reading of the electrometer can be used to calibrate same.

A problem with this approach is the need to remove the electrometer probe support from the supporting structure to another device which provides inconvenience and adds to the cost of service by requiring additional parts.

The aforementioned U.S. patent in an alternate embodiment describes a conductive test plate that is built into the reproduction machine at a location adjacent the imaging member. An electrometer probe is supported for translational movement to overlie the test plate for calibration purposes or to overlie the imaging member for sensing voltages or potentials on the imaging member. A problem with this device is that additional supporting structure is needed to accurately locate the test plate.

It is therefore an object of the present invention to provide a new and improved apparatus and method for calibrating and using electrometers with electrostatographic reproduction machines.

The invention and its various advantages will become more apparent to those skilled in the art from the ensuing detailed description of preferred embodiments, reference being made to the accompanying drawings.

SUMMARY OF THE INVENTION

In accordance with a first aspect of the invention there is provided an electrostatographic recording apparatus comprising a moving imaging member with a surface for supporting an electrostatic charge and an electrometer for sensing the electrostatic charge on the surface, the electrometer including a probe support member having an electrically conductive member movable with the support member and having a surface that supports the electrometer in each of two orientations of the probe, wherein in a first orientation of the probe the probe is supported by the support member to sense a voltage level on the surface of the imaging member, and wherein in a second orientation of the probe the probe is supported by the support member to sense a voltage level on the conductive member.

In accordance with a second aspect of the invention, there is provided a method for use in calibrating an electrometer used in an electrostatographic recording apparatus, the method comprising supporting an electrometer probe on a probe support member in a first orientation so that the probe is in a position for sensing a level of charge on an image recording surface; repositioning the probe on the probe support member by providing at least rotational movement of the probe to orient the probe to sense a voltage level on an electrically biased conductive member with the probe being in a second orientation; applying a voltage bias to the conductive member; and operating the electrometer probe to sense the voltage bias on the conductive member.

BRIEF DESCRIPTION OF THE DRAWINGS

The subsequent description of the preferred embodiments of the present invention refers to the attached drawings, wherein.

DETAILED DESCRIPTION OF THE INVENTION

Because apparatus of the general type described herein are well known the present description will be directed in particular to elements forming part of, or cooperating more directly with, the present invention. While the invention will be described with reference to an electrophotographic system the invention can also be used in an electrographic system too.

Figure 1:
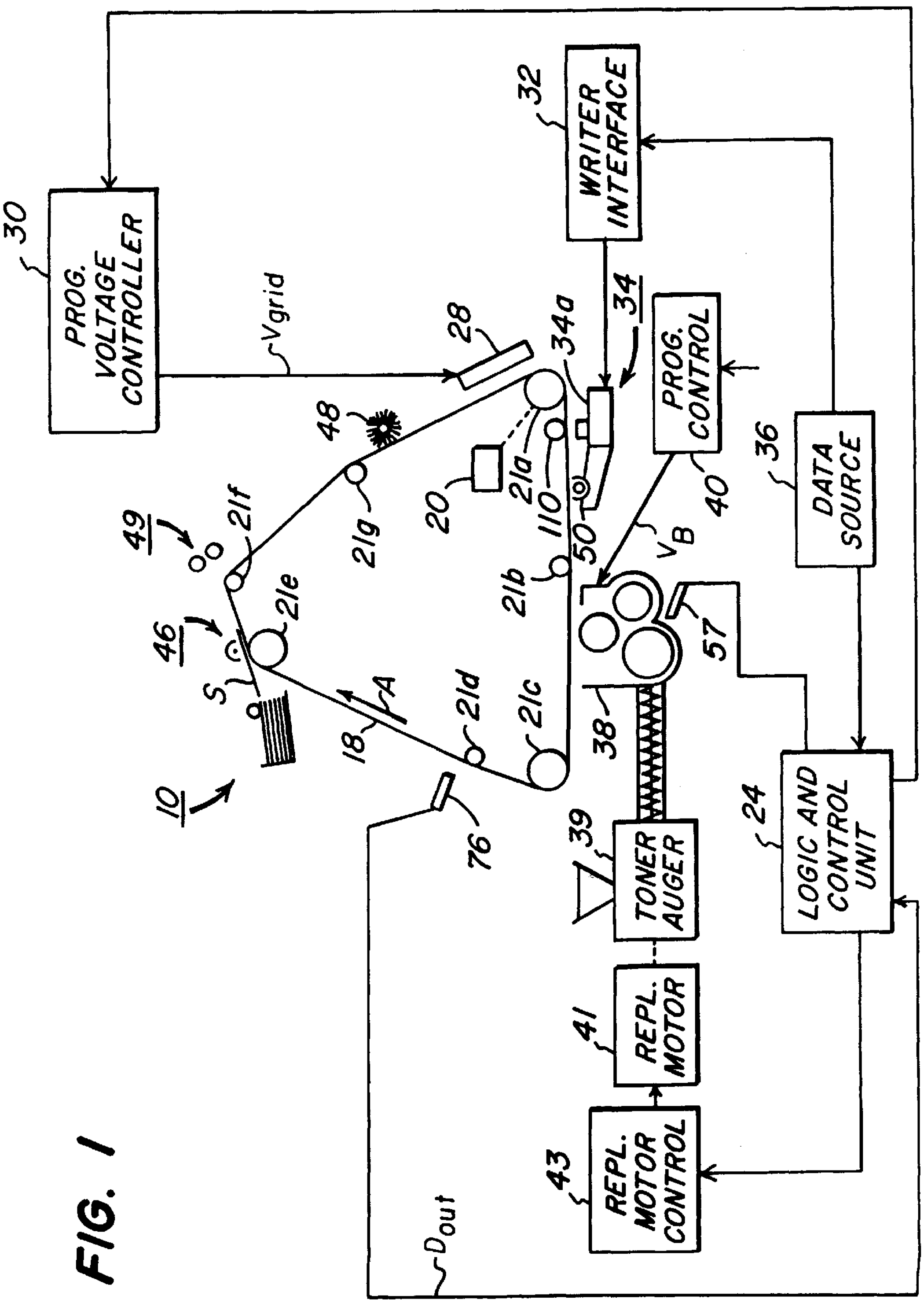
FIG. 1 is a schematic showing a side elevational view in schematic form of an electrostatographic machine that is used in accordance with a preferred embodiment of the invention.

With reference to the electrostatographic copier and/or printer machine 10 as shown in FIG. 1, a moving recording member such as photoconductive belt 18 is entrained about a plurality of rollers or other supports 21*a–g* one or more of which are driven by a motor 20 so as to advance the belt in a direction indicated by an arrow A past a series of work stations of the copier/printer machine. A photoconductive drum may be used instead of a belt. A logic and control unit (LCU) 24, which has a digital computer, has a stored program for sequentially actuating the work stations in response to signals from various sensors and encoders as is well known.

Briefly, a primary charging station 28 sensitizes belt 18 by applying a uniform electrostatic charge of predetermined primary voltage $V_0$ to the surface of the belt. The output of the charging station is regulated by a programmable voltage controller 30, which is in turn controlled by LCU 24 to adjust primary voltage $V_0$ for example through control of electrical potential ($V_{grid}$) to a grid that controls movement of corona charges from charging wires to the surface of the recording member as is well known. Other known forms of chargers, including roller chargers, may also be used.

At an exposure station 34, projected light from a write head 34*a* dissipates the electrostatic charge on the photoconductive belt to form a latent image of a document to be copied or printed. The write head preferably has an array of light-emitting diodes (LEDs) or other light source such as a laser or other spatial light modulator for exposing the photoconductive belt picture element (pixel) by picture element with a regulated intensity and exposure, Eo. Alternatively, the exposure may be by optical projection of an image of a document or a patch onto the photoconductor.

Where an LED or other electro-optical exposure source or writer is used, image data for recording is provided by a data source 36 for generating electrical image signals. The data source 36 may be a computer, a document scanner, a memory, a data network, etc. Signals from the data source and/or LCU may also provide control signals to a writer interface 32 for identifying exposure correction parameters in, for example, a look-up table (LUT) for use in controlling image density. Travel of belt 18 brings the areas bearing the latent charge images into a development station 38. The development station has one (more if color) magnetic brushes in juxtaposition to, but spaced from, the travel path of the belt. Magnetic brush development stations are well known. For example, see U.S. Pat. Nos. 4,473,029 to Fritz et al and 4,546,060 to Miskinis et al. Other types of development stations may be used as is well known and plural development stations may be provided for developing images in plural colors or with toners of different physical characteristics.

LCU 24 selectively activates the development station in relation to the passage of the image areas containing latent images to selectively bring the magnetic brush into engagement with or a small spacing from the belt. The charged toner particles of the engaged magnetic brush are attracted imagewise to the latent image pattern to develop the pattern.

As is well understood in the art, conductive portions of the development station, such as conductive applicator cylinders, act as electrodes. The electrodes are connected to a variable supply of D.C. potential $V_B$ regulated by a programmable controller 40. Details regarding the development station are provided as an example, but are not essential to the invention.

A transfer station 46 as is also well known is provided for moving a receiver sheet S into engagement with the photoconductive belt in register with the image for transferring the image to a receiver. Alternatively, an intermediate member may have the image transferred to it and the image may then be transferred to the receiver. A cleaning station 48 is also provided subsequent to the transfer station for removing toner from the belt 18 to allow reuse of the surface for forming additional images. In lieu of a belt a drum photoconductor or other structure for supporting an image may be used. After transfer of the unfixed toner images to a receiver sheet, such sheet is detacked from the belt and transported to a fuser station 49 where the image is fixed.

The LCU provides overall control of the apparatus and its various subsystems as is well known. Programming commercially available microprocessors is a conventional skill well understood in the art.

Figure 2:
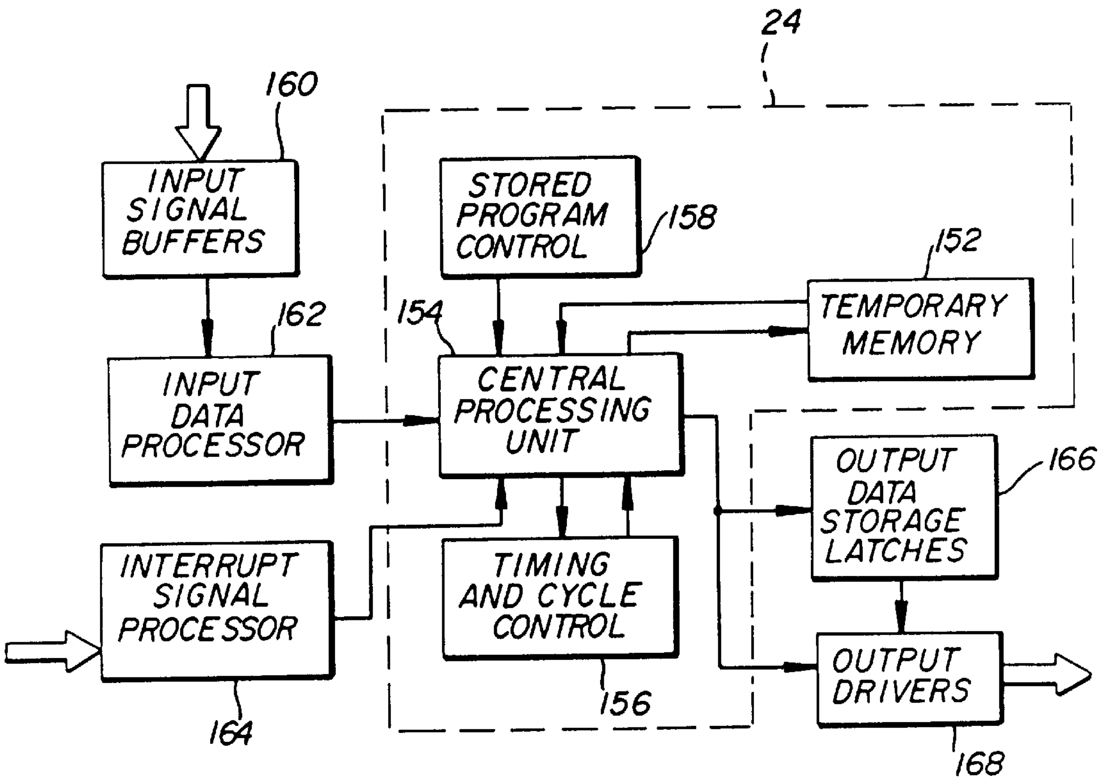
FIG. 2 is a block diagram of a logic and control unit shown in FIG. 1.

Referring to FIG. 2, a block diagram of a typical LCU 24 is shown. The LCU comprises temporary data storage memory 152, central processing unit 154, timing and cycle control unit 156, and stored program control 158. Data input and output is performed sequentially through or under program control. Input data are applied either through input signal buffers 160 to an input data processor 162 or through an interrupt signal processor 164. The input signals are derived from various switches, sensors, and analog-to-digital converters that are part of the apparatus 10 or received from sources external to machine 10.

The output data and control signals are applied directly or through storage latches 166 to suitable output drivers 168. The output drivers are connected to appropriate subsystems.

Process control strategies generally utilize various sensors to provide real-time control of the electrostatographic process and to provide "constant" image quality output from the user's perspective.

One such sensor may be a densitometer 76 to monitor development of test patches in non-image areas of photoconductive belt 18, as is well known in the art, see for example U.S. Pat. No. 5,649,266. The densitometer is intended to ensure that the transmittance or reflectance density of a toned patch on the belt is maintained. The densitometer may be comprised of an infrared LED which shines through the belt or is reflected by the belt onto a photodiode. The photodiode generates a voltage proportional to the amount of light received. This voltage is compared to the voltage generated due to transmittance or reflectance of a bare patch, to give a signal, $D_{out}$, representative of an estimate of toned density. This signal $D_{out}$ may be used to adjust process parameters $V_0$, $E_0$, or $V_B$; and, to assist in the maintenance of the proper concentration of toner particles in the developer mixture by having the LCU provide control signals to a replenisher motor control 43 which controls replenisher motor 41 that drives a toner auger

39 for feeding new toner particles into the development station 38. A toner concentration monitor probe 57 provides signals to the LCU about relative concentration of toner particles with respect to carrier particles in the developer mix.

A second sensor useful for monitoring process parameters is an electrometer probe 50 which is mounted at a location preferably downstream of the corona charging station 28 relative to the direction of the movement of the belt 18 which direction is indicated by the arrow A. In the example illustrated in FIG. 1 the electrometer probe 50 is mounted immediately downstream of the writehead 34*a*. The apparatus for supporting the electrometer probe in position for sensing charge on the photoconductive member or belt 18 and for providing for calibration of the electrometer probe will now be described.

Figure 3:
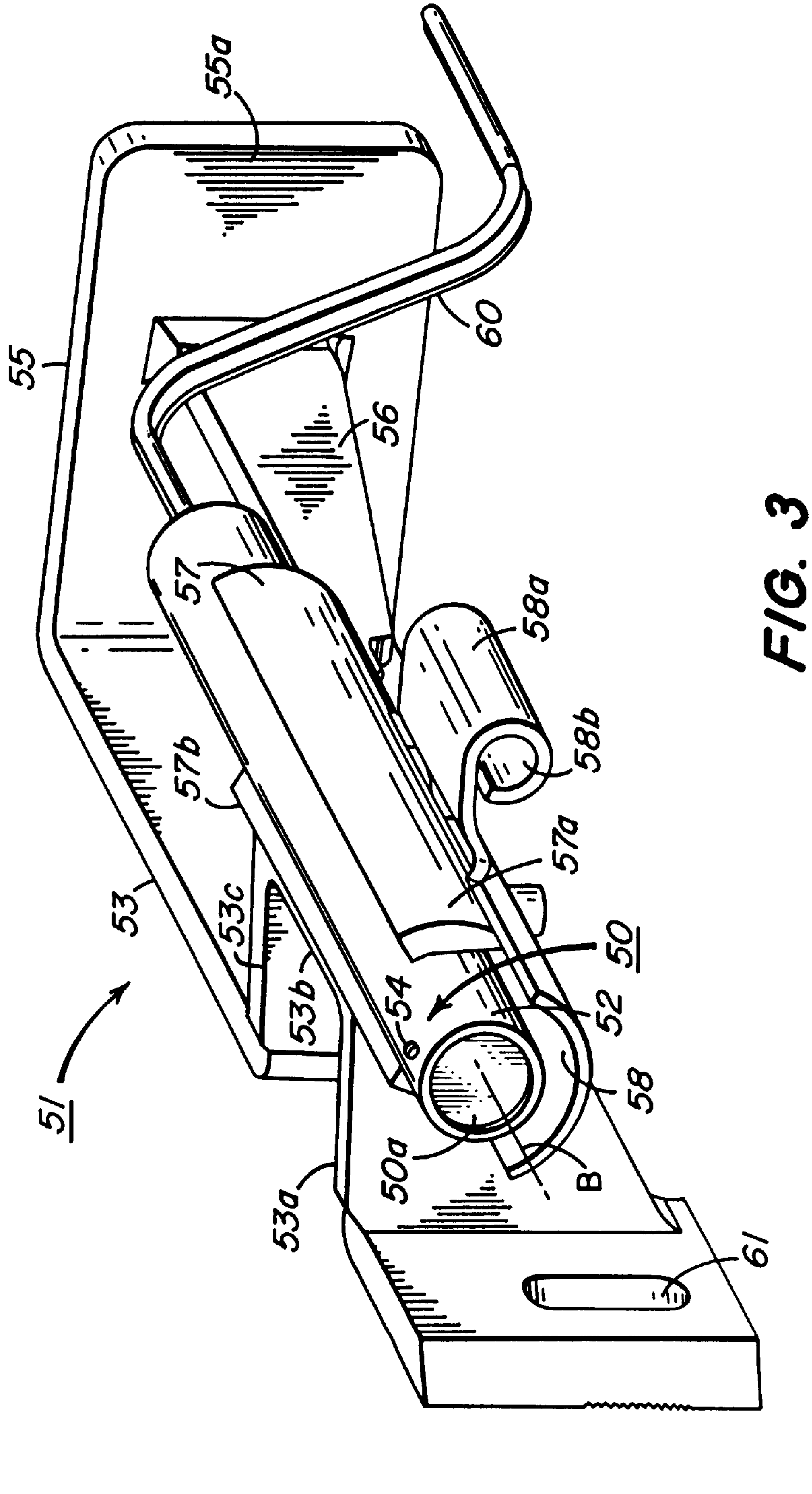
FIGS. 3 and 4 are respective perspective views of an electrometer probe support member and electrometer probe in accordance with the invention.
Figure 4:
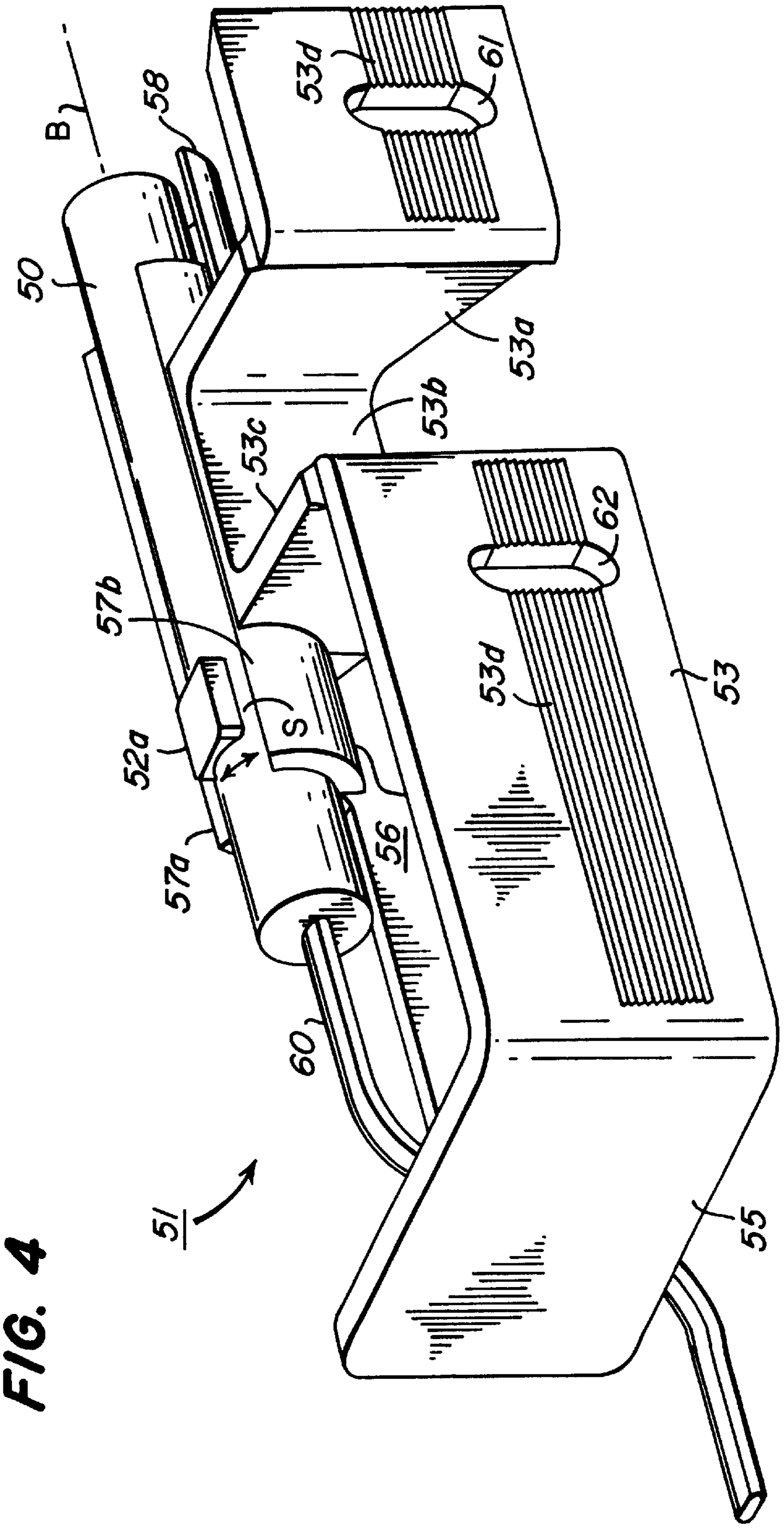

With reference now to FIGS. 3 and 4, an electrometer probe support member 51 includes upstanding walls 53 and 55 that are generally at right angles to each other. Wall 53 has an inwardly extending recess formed by walls 53*a, b, c* which defines a projection for supporting an elongated arcuate seat 57 formed by arcuate holding portions or members 57*a,* 57*b* that serve as reception elements for a press-fit hold of the generally cylindrical electrometer probe 50 which is frictionally supported between the arcuate members 57*a,* 57*b* as the probe rests in the seat or cradle 57. The electrometer probe 50 may be moved into and out of engagement with the probe support member 51 by moving the probe between the arcuate holding members 57*a,* 57*b* under hand pressure to cause at least one of the arcuate holding members 57*a,* 57*b* to flex to allow clearance to the probe. After the probe is seated in the orientations illustrated in FIGS. 3 or 4, the arcuate members 57*a,* 57*b* return to a less stressed state and squeeze the probe to frictionally hold it in place. In FIG. 3, the probe is oriented in its operative position for sensing a voltage or electrical potential of the charge on the belt 18. In the orientation of FIG. 4, the probe is shown oriented for its calibration mode.

A projection arm 56 extends from an inner face 55*a* of wall 55 in the axial direction B of the probe to provide an additional support for the seat 57. An arcuate metal plate 58, which is electrically conductive, is supported at a fixed spacing from the electrometer probe 50. The metal plate includes portions which overlap and engage the outer surfaces of arcuate portions 57*a,* 57*b*. The electrometer probe 50 includes an electrically conductive cylindrical outer casing 52 of for example brass that has an aperture 54 formed therein through which an electrostatic field on the photoconductor may be sensed by the sensor or transducer portion of the probe which is located within the casing 52 so that the sensor 50*a* is aligned with the aperture 54. A detent dog 52*a* (FIG. 4) is fixed on the outer surface of the casing 52 and in the probe orientation shown in FIG. 3 the dog 52*a* is seated within detent recess or opening 57*c* in seat 57 to thereby lock probe 50 in the orientation for sensing charge on belt 18. An electrical wire cable 60 is connected at one end of the electrometer probe for connection of the electrometer probe to electrical control circuitry (not shown) for providing electrical power and control signals to the electrometer probe and for carrying electrical signals to the control circuitry for converting sensor outputs into secondary electrical signals for input into the LCU 24. The metal plate 58 has connected thereto or integrally formed therewith a receptacle for receiving an electrical connector. More specifically, a single metal plate has a projection portion 58*a* that is turned to define a cylindrical opening 58*b* for snugly receiving a "banana" type test plug. Wall 53 has openings 61 and 62 therein for receiving bolts or screws for attaching the probe support member to the slide block 81 (see FIG. 7). An elongated grating-like or series of parallel grooves 53*d* is machined or molded into wall 53 in the direction parallel to that of probe axis B for mating with a rib 81*a* formed on the slide block 81 that is mounted on the printer housing. By adjustment of which groove 53 mates with the rib 81*a* the electrometer probe support member 51 may be adjusted in the direction of the arrow C (FIG. 7) before tightening the bolts (not shown) extending through elongated apertures 61, 62 that are used to lock the probe support member 51 to the slide block 81.

Figure 7:
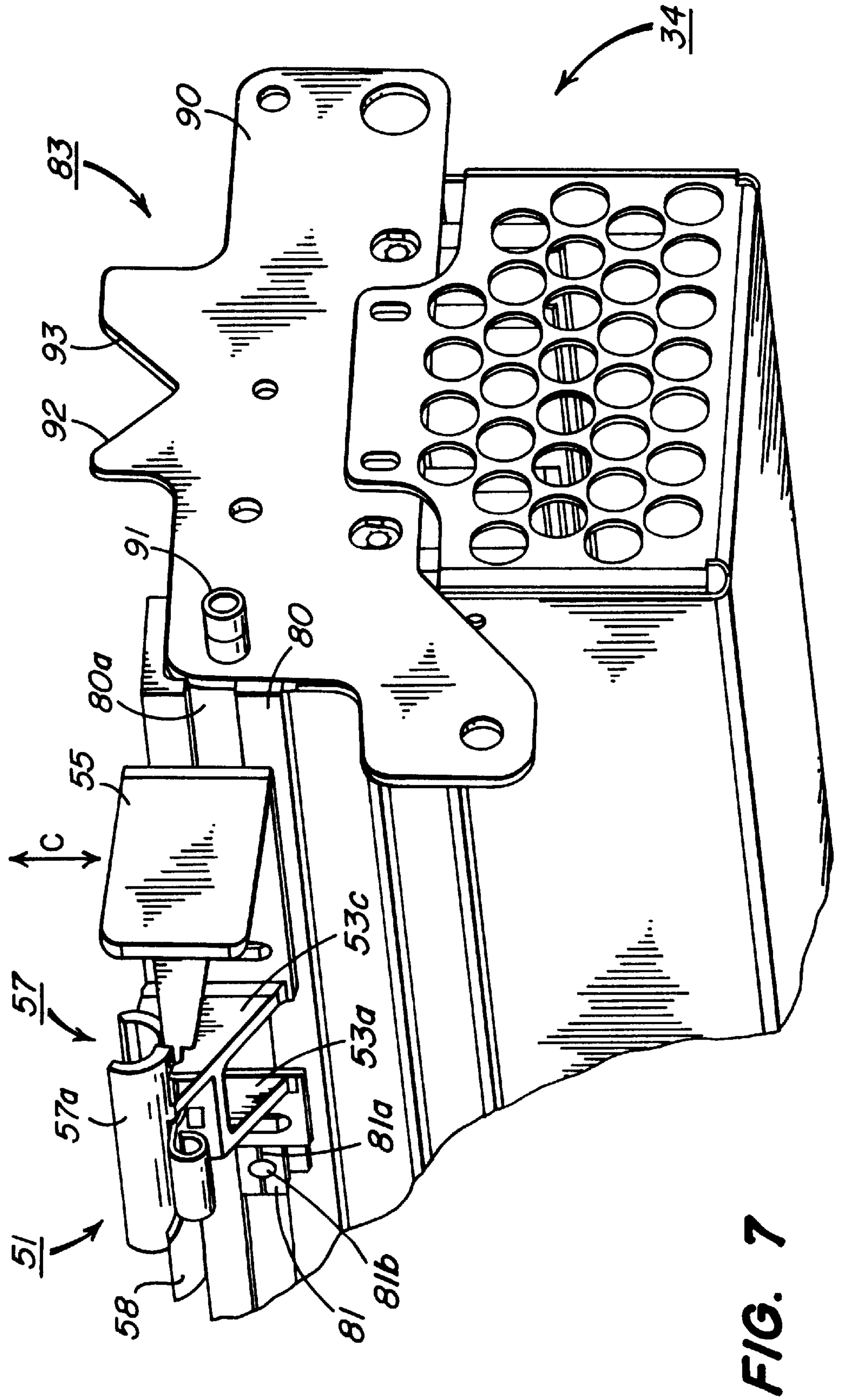
FIG. 7 is a perspective view of the electrometer probe support member mounted upon a supporting structure that provides for cross-track movement of the electrometer probe.
Figure 8:
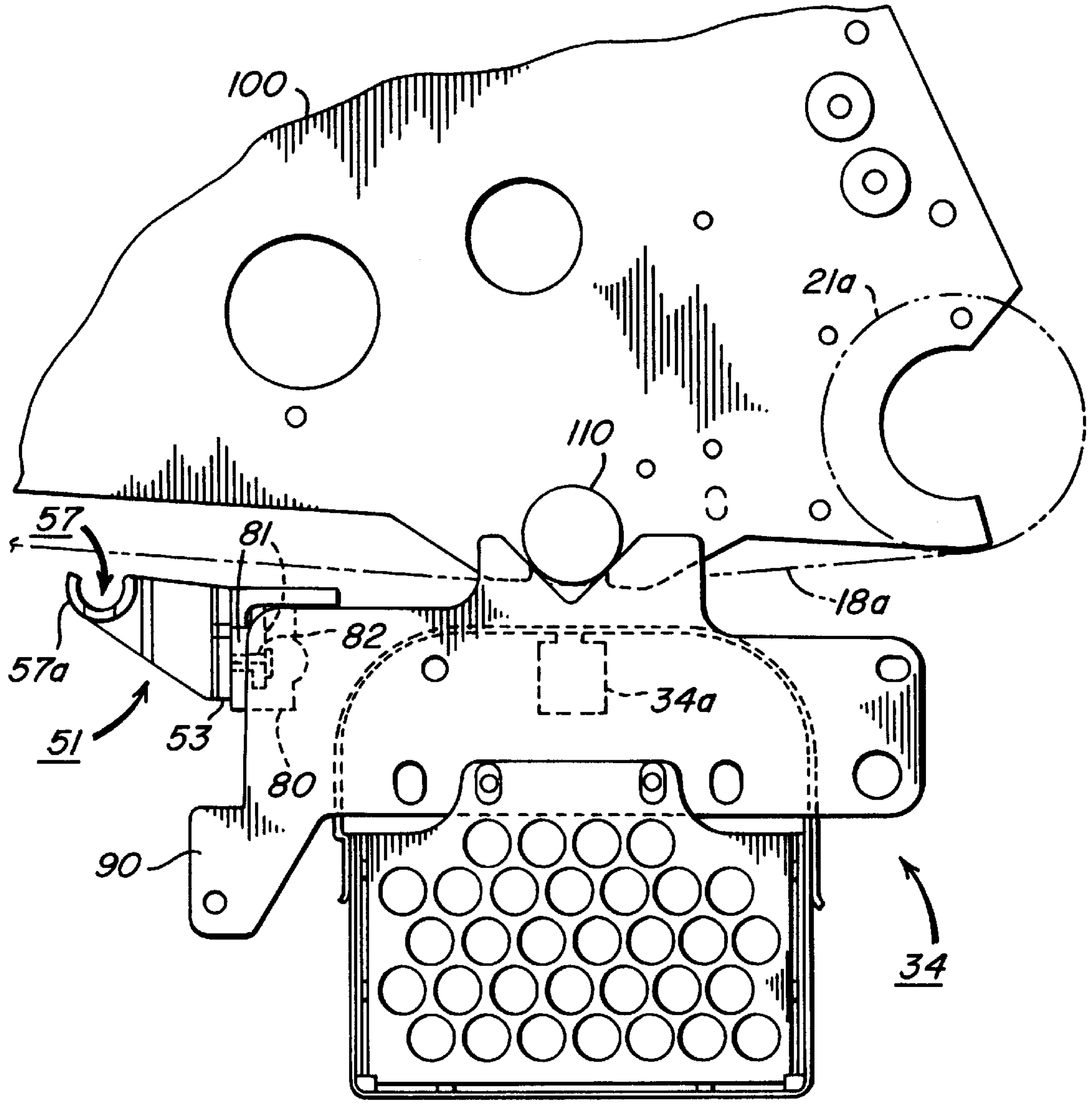
FIG. 8 is a side elevation view of the supporting structure and the electrometer probe support member mounted on a printhead support member.

With reference now also to FIGS. 7 and 8, the T-shaped slide block 81 is mounted in a slide block support member 80 that includes structure that defines a complementary shaped guide channel 80*a* allowing movement of the slide block 81 in the cross-track direction of the belt 18 or parallel to the direction of the row of LEDs of the writehead 34*a* which is perpendicular to the in-track or of the row of LEDs of the writehead 34*a* which is perpendicular to the in-track or process direction of movement of the belt 18 indicated by the arrow A in FIG. 1. The slide block 81 may be locked in place by a spring-biased detent device 82 or other known suitable locking device such as a setscrew, etc., after being positioned at the desired transverse or cross-track location of the belt 18 which is established by engagement of the detent's ball or dog in a desired detent recess formed in sliding block's guide channel 80*a*. The slide block support member 80 is mounted to a printhead assembly support structure 83 which mounts the LED printhead 34*a*. The printhead assembly support structure 83 in turn is mounted and fixed to end plates 90, one of which is shown in FIGS. 7 and 8. A pin 91 on the end plate 90 is fixed to a hooking member (not shown) that is supported on the machine frame. An upward force imposed by the hook urges V-shaped lands 92 and 93 to locate against a pin 110 associated with the machine frame 100 to accurately locate the printhead 34*a* and the electrometer probe relative to the path 18*a* of the belt 18 which is also defined by the pin 110 or other structure supported by the machine frame 100 that are in fixed positions relative to pin 110. Removing the hook from the pin 91 allows the printhead assembly and the electrometer support and probe to be moved away from the imaging member to allow access by a service person to the imaging member at this location.

Figure 5:
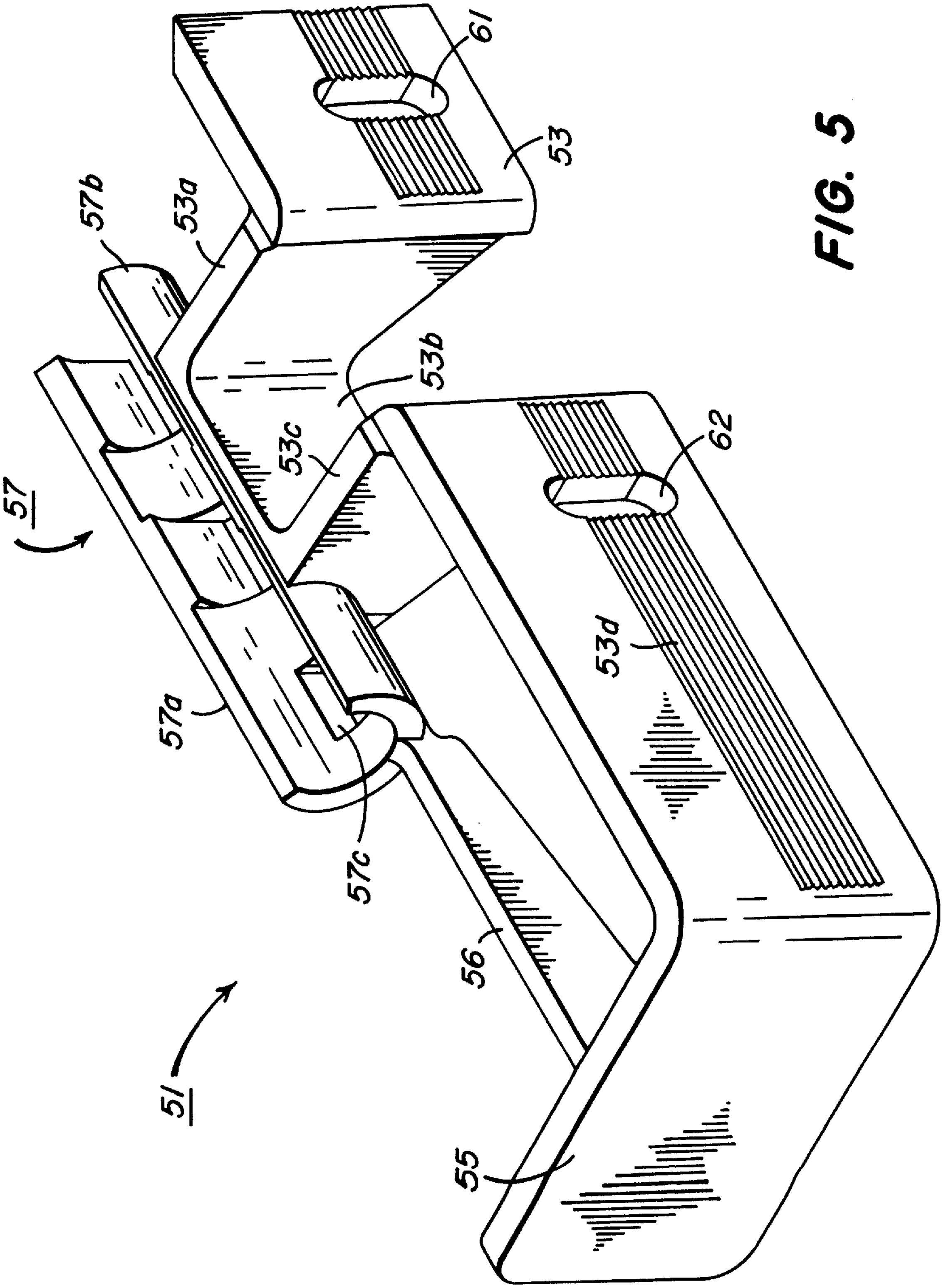
FIGS. 5 and 6 are perspective views of the electrometer support member but showing the electrometer probe removed from the electrometer probe support member.
Figure 6:
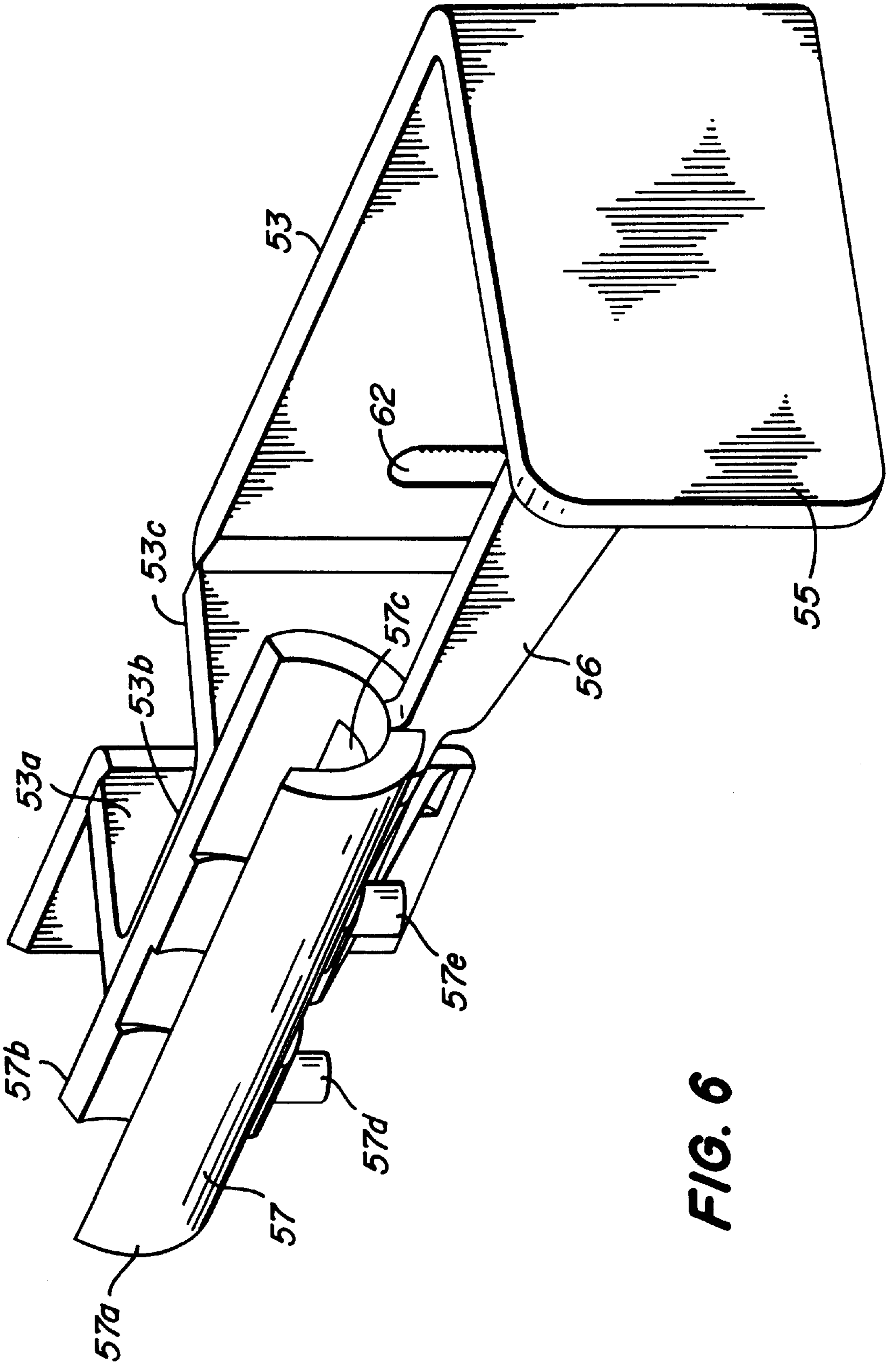

The probe support member 51 as shown in FIGS. 5 and (not including the metal plate 58), may desirably be molded or formed in one piece of electrically insulating plastic such as, for example, a polycarbonate or nylon. The metal plate 58 is positioned on the probe support member and permanently locked in place by applying heat and pressure to pins 57*d, e* which pass through locating openings in the metal plate. The pins 57*d, e* are molded integrally with the probe support member and are of the same material. The heat and pressure, through a known process of heat staking is such as to deform the pins to lock the metal plate 58 upon the probe support member 51.

In operation, the probe 50 is supported as shown in FIG. 3 with the aperture 54 facing upwardly to detect electrostatic charge on the photoconductive belt 18 passing above the probe so that a fixed distance is maintained between the charge bearing surface of belt 18 and the aperture 54 of the electrometer casing which is accurately spaced from the electrometer's sensor. The probe is positioned by movement of the probe support member by a service person to the desired cross-track position of the belt 18 as discussed above. Movement of the probe in the cross-track direction of the belt is facilitated by using wall 55 as a handle for moving the probe support member 51 and slide block 81 to a desired detent locking position of the slide block 81 along slide block support member guide channel 80*a*. Plural detent locking positions are provided on channel 80*a* for allowing adjustment of the electrometer opening 54 to plural cross-track sensing positions wherein the belt overlies the electrometer opening 54. This allows the electrometer to be moved to measure the electrical potential on the belt at various cross-track positions to check the uniformity of the primary charger. When it is desired to calibrate the probe to determine if it is operating correctly, a fixed voltage bias is provided to a connecting wire (not shown) having a banana type plug that is received within recess 58*b*. This voltage bias may be provided by connecting development station bias $V_B$ to the plug. The probe 50 is lifted from the seat 57 and rotated by a service person or by automatic means, if provided, about probe axis B and the probe 50 is reseated on the seat 57 so that the probe opening 54 is now at a fixed distance from the inside surface of arcuate member 58. As may be seen in FIG. 4, a clearance space S exists between the detent dog 52*a* and the arcuate portions 57*a, b*. This clearance allows for some inexactness in the orientation of the probe 50 when in the calibration mode. However, the arcuate member 58 is curved as a segment of a circle or as a cylinder to provide equal spacing of the aperture 54 to the closest part of the surface 58 so that there is no criticality in the exact orientation of the probe in the calibration mode. With known electrical voltage bias(es) applied to arcuate member 58 using a service test program, the voltage output signals from the electrometer probe can be monitored or compared with the known voltage(s) to determine if the probe reading is within a range of values considered to be substantially equal to that of the known voltage. The distance between the surface of the arcuate member 58 and the probe aperture 54 is substantially identical to that of the spacing of the aperture 54 to the photoconductor when the probe is positioned for normal operation of the sensing charge on the photoconductor. This allows the probe to be tested for calibration at a spacing from the test surface equivalent to that of normal use and minimizes the likelihood of positioning errors during calibration.

An advantage is obtained in using $V_B$ for the high voltage reference. Process control typically sets $V_B$ according to electrometer measurements. Use of the same $V_B$ source during calibration assures that any error in $V_B$ is nulled. For example, suppose the $V_B$ power supply has a 50 volt offset or error. When the $V_B$ power supply is commanded to output 500 volts, it actually delivers only 450 volts to the calibration plate. The electrometer, when calibrated to the inaccurate reference voltage, interprets an actual surface voltage of 450 volts as 500 volts. Likewise, subsequent measurement of an actual PC voltage of 500 volts is interpreted as 550 volts. If the process control objective is to match $V_B$ to measured PC voltage, the $V_B$ supply is commanded to output 550 volts, but actually delivers only 500 volts. Thus the objective of matched PC and $V_B$ voltage is accomplished despite the inaccuracy in the $V_B$ power supply.

The detent dog 52*a* is made of a height such that when the probe 50 is in the orientation of FIG. 4 (calibration made orientation) and the probe support holder is moved in the belts cross-track direction so that the belt 18 overlies the probe 50 and the planar top of the dog should have belt 18 resting thereon. Thus, the dog 52*a* can be used as a positioning guide when the belt's position is being adjusted on the machine or to determine correct positioning of the electrometer probe vis-à-vis the charged surface of belt 18. As noted above, the slide block 81 or travel member may be locked in place at one of the plural fixed detent positions. It is desirable to have one of these detent positions be located so that the probe 50 and probe support member 51 are clear of the belt 50, to facilitate removal of the probe from the seat 57 for orienting the probe for calibration or after calibration for reorienting the probe so that the opening 54 will now face towards the surface of the belt when the probe is moved in the cross-track direction to a detent position used for sensing charge on the belt surface. To ensure that the probe is rotated the proper amount, a detent recess 57*c* is provided in the seat 57 for cooperating with the detent dog 52*a* to lock the probe 50 in the proper orientation and position when the dog is seated within the recess. The recess and dog are appropriately shaped to allow seating of the dog 52*a* within the recess 57*c* so that the cylindrical probe rests on the seat 57 and the probe is then accurately located on the seat 57. A further advantage for providing the clearance of the belt, i.e., not covered, by the belt is to allow inspection of the electrometer for contamination without moving the printhead away from the photoconductor.

Other modifications include providing a seat which allows the probe to be moved only through rotation between the calibration and the operative position for sensing charge on the belt.

The invention has been described in detail with particular reference to certain preferred embodiments thereof, but it will be understood that variations and modifications can be effected within the spirit and scope of the invention.

What is claimed is:

1. An electrostatographic recording apparatus comprising a moving imaging member with a surface for supporting an electrostatic charge and an electrometer probe for sensing the electrostatic charge on the surface, the electrometer probe including:

a probe support member having an electrically conductive member movable with the support member and having a surface that supports the electrometer probe in each of two orientations of the probe, wherein in a first orientation of the probe the probe is supported by the support member to sense a voltage level on the surface of the imaging member, and wherein in a second orientation of the probe the probe is supported by the support member to sense a voltage level on the conductive member for calibration of the probe and wherein the first and second orientations are so related as to require rotation of the probe about an axis passing through the probe for the probe to be moved from the first orientation to the second orientation.

2. The apparatus of claim 1 and including a receptacle for receiving and supporting an electrical connection for providing a voltage bias to the conductive member.

3. The apparatus of claim 2 wherein the probe includes a casing and an opening in the casing through which the probe senses voltage levels and wherein the probe support member supports the probe so that the opening of the casing of the probe is at a first fixed distance from the surface of the imaging member when the probe is in the first orientation and the support member supports the probe so that the opening is at a second fixed distance from the conductive member when the probe is in the second orientation and wherein the first and second distances are substantially equal.

4. The apparatus of claim 1 and including a travel member that is movable in a direction cross-track of the moving imaging member, the probe support member being mounted for movement with the travel member and the probe support member being movable to a position wherein the probe and the probe support member are clear of the imaging member to facilitate access of an operator to the probe.

5. The apparatus of claim 1 wherein the conductive member includes a curved conductive surface; and the probe includes a stop member; and the probe is supported by the support member so as to allow placement of the probe at a limited range of possible rotationally related orientations when the probe is in the second orientation;

the stop member cooperates with the probe support member to control the range of possible orientations of the probe; and the curved conductive surface is of an arcuate length related to the range of possible orientations of the probe.

6. The apparatus of claim 5 wherein the stop member is received in a recess of the surface of the probe support member when the probe is in the first orientation.

7. The apparatus of claim 6 wherein the stop member is of a height that when the probe is in the second orientation a surface of the stop locates a plane of the surface of the imaging member.

8. The apparatus of claim 5 and including a plug support for receiving and supporting an electrical plug for providing a voltage bias to a conductive member.

9. The apparatus of claim 5 wherein the probe includes a casing and an opening in the casing through which the probe senses voltage levels and wherein the probe support member supports the probe so that the opening of the casing of the probe is at a first fixed distance from the surface of the imaging member when the probe is in the first orientation and the support member supports the probe so that the opening is at a second fixed distance from the conductive member when the probe is in the second orientation and wherein the first and second distances are substantially equal.

10. The apparatus of claim 1 wherein the conductive member includes an electrically conductive surface that forms a generally circularly curved segment with the center of the curved segment coinciding with a rotation center of the probe.

11. The apparatus of claim 1 and including a travel member that is movable in a direction cross-track of the moving imaging member, the probe support member being mounted for movement with the travel member and the probe support member being movable to plural predetermined positions and fixed in the predetermined positions by a detent.

12. An electrostatographic recording apparatus comprising a moving imaging member with a surface for supporting an electrostatic charge and an electrometer probe for sensing the electrostatic charge on the surface, the electrometer probe including:

a probe support member having an electrically conductive member movable with the support member and having a surface that supports the electrometer probe in each of two orientations of the probe, wherein in a first orientation of the probe the probe is supported by the support member to sense a voltage level on the surface of the imaging member, and wherein in a second orientation of the probe the probe is supported by the support member to sense a voltage level on the conductive member; and wherein the conductive member includes a curved conductive surface; and the probe includes a stop member; and the probe is supported by the support member so as to allow placement of the probe at a limited range of possible rotationally related orientations when the probe is in the second orientation;

the stop member cooperates with the probe support member to control the range of possible orientations of the probe; and the curved conductive surface is of suitable arcuate length to be usable for calibrating the probe when the probe is supported in the range of possible orientations of the probe.

13. The apparatus of claim 12 wherein the stop member is received in a recess of the surface of the probe support member when the probe is in the first orientation.

14. The apparatus of claim 13 wherein the stop member is of a height that when the probe is in the second orientation a surface of the stop locates a plane of the surface of the imaging member.

15. The apparatus of claim 12 and including a plug support for receiving and supporting an electrical plug for providing a voltage bias to a conductive member.

16. The apparatus of claim 12 wherein the probe includes a casing and an opening in the casing through which the probe senses voltage levels and wherein the probe support member supports the probe so that the opening of the casing of the probe is at a first fixed distance from the surface of the imaging member when the probe is in the first orientation and the support member supports the probe so that the opening is at a second fixed distance from the conductive member when the probe is in the second orientation and wherein the first and second distances are substantially equal.

17. For use in an electrostatographic recording apparatus having an imaging member with a surface for supporting an electrostatic charge and a generally cylindrical electrometer probe for sensing the electrostatic charge on the surface, the probe including a stop member, an electrometer probe support member comprising:

an arcuate member having an inner arcuate surface for supporting the probe in a first orientation for sensing charge on the imaging member and in a second orientation for use in calibration of the probe wherein the probe is required to be rotated about an axis passing through the probe to move from the first orientation to the second orientation, the arcuate member having a clearance space between sides of the arcuate member;

an arcuate conductive surface having a generally circularly curved segment that is located so that a center of the curved segment is located upon the probe axis;

the surface for supporting the probe allowing placement of the probe at a limited range of possible rotationally related orientations when the probe is in the second orientation wherein the stop member cooperates with the sides of the arcuate member to control the range of possible orientations of the probe; and the curved conductive surface is of suitable arcuate length to be usable for calibrating the probe when the probe is supported in the range of possible rotational related orientations of the probe.

18. The electrometer support member of claim 17 wherein the arcuate surface includes a recess or an opening and the stop member is receivable in the recess or opening of the surface of the probe support member when the probe is in the first orientation to lock the probe in the first position.

19. A method for use in calibrating an electrometer used in an electrostatographic recording apparatus, the method comprising:

supporting an electrometer probe on a probe support member in a first orientation so that the probe is in a position for sensing a level of charge on an image recording surface of the apparatus;

repositioning the probe on the probe support member by providing at least rotational movement of the probe about an axis passing through the probe to orient the probe to sense a voltage level on an electrically biased conductive member with the probe being in a second orientation;

applying a voltage bias to the conductive member; and operating the electrometer probe to sense the voltage bias on the conductive member for calibrating the electrometer.

20. The method of claim 19 wherein the conductive member includes a curved conductive surface that is a circularly curved segment having a center located upon the axis and in the step of repositioning the probe, the probe may be repositioned within a range of different rotationally related orientations wherein the probe is equally spaced from the curved conductive surface and the probe is operated to sense the voltage bias on the conductive member when positioned at any of the different rotationally related orientations that are within the range.

21. The method of claim 19 wherein the probe is moved to a position wherein the probe and the probe support member are not covered by the image recording surface to facilitate access of an operator to the probe.

22. The method of claim 19 wherein the voltage bias is related to a voltage bias, $V_B$, associated with a development station and the electrometer is calibrated relative to the voltage bias and signals from the electrometer are used to adjust process control variables for controlling image quality produced by the recording apparatus.

23. The method of claim 19 wherein the probe is moved to plural cross-track positions of the image recording surface so that the electrical potential on the image recording surface at plural cross-track locations can be determined.

* * * * *